(12) United States Patent
Sun et al.

(10) Patent No.: US 11,742,241 B2
(45) Date of Patent: Aug. 29, 2023

(54) ALD (ATOMIC LAYER DEPOSITION) LINER FOR VIA PROFILE CONTROL AND RELATED APPLICATIONS

(71) Applicant: TOKYO ELECTRON LIMITED, Tokyo (JP)

(72) Inventors: Xinghua Sun, Albany, NY (US); Yen-Tien Lu, Albany, NY (US); Angelique Raley, Albany, NY (US); David O'Meara, Albany, NY (US); Jeffrey Smith, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/487,987

(22) Filed: Sep. 28, 2021

(65) Prior Publication Data

US 2022/0020642 A1    Jan. 20, 2022

Related U.S. Application Data

(63) Continuation of application No. 16/508,923, filed on Jul. 11, 2019, now Pat. No. 11,164,781.

(Continued)

(51) Int. Cl.
*H01L 21/768* (2006.01)
*H01L 21/02* (2006.01)
(Continued)

(52) U.S. Cl.
CPC .... *H01L 21/76897* (2013.01); *H01L 21/0228* (2013.01); *H01L 21/0274* (2013.01); *H01L 21/31116* (2013.01); *H01L 21/32056* (2013.01); *H01L 21/76807* (2013.01); *H01L 21/76811* (2013.01); *H01L 21/76814* (2013.01); *H01L 21/76816* (2013.01); *H01L 21/76831* (2013.01)

(58) Field of Classification Search
CPC .......... H01L 21/76897; H01L 21/0228; H01L 21/76831; H01L 21/76814; H01L 2221/1063; H01L 21/76811
See application file for complete search history.

(56) References Cited

U.S. PATENT DOCUMENTS 9,466,723 B1   10/2016 Huang et al.
9,691,659 B1   6/2017  Mignot et al.
(Continued)

*Primary Examiner* — Ahmed N Sefer
(74) *Attorney, Agent, or Firm* — WEIHROUCH IP

(57) ABSTRACT

Methods are disclosed that provide improved via profile control by forming atomic layer deposition (ALD) liners to protect side walls of vias during subsequent etch processes. ALD liners can be used for BEOL etch processes as well as for full self-aligned via (FSAV) processes and/or other processes. For one embodiment, ALD liners are used as protection or sacrificial layers for vias to reduce damage during multilayer via or trench etch processes. The ALD liners can also be deposited at different points within process flows, for example, before or after removal of organic planarization layers. The use of ALD liners facilitates shrinking of via critical dimensions (CDs) while still controlling via profiles for various process applications including dual Damascene processes and FSAV processes. In addition, the use of ALD liners improves overall CD control for via or hole formation as well as device yield and reliability.

19 Claims, 10 Drawing Sheets

Related U.S. Application Data

(60) Provisional application No. 62/767,805, filed on Nov. 15, 2018, provisional application No. 62/696,540, filed on Jul. 11, 2018.

(51) Int. Cl.
*H01L 21/311* (2006.01)
*H01L 21/027* (2006.01)
*H01L 21/3205* (2006.01)

(56) References Cited

U.S. PATENT DOCUMENTS

| | | |
|---|---|---|
| 2007/0040188 A1 | 2/2007 | Tsai et al. |
| 2007/0134917 A1* | 6/2007 | Li .................... H01L 21/76808 438/637 |
| 2008/0311755 A1* | 12/2008 | Zin .................... H01L 21/76813 438/700 |
| 2009/0286381 A1 | 11/2009 | Van Schravendijk et al. |
| 2013/0236989 A1* | 9/2013 | Ranjan .............. H01L 21/02271 438/5 |
| 2015/0299886 A1 | 10/2015 | Doubina et al. |
| 2016/0064274 A1 | 3/2016 | Peng et al. |
| 2016/0099174 A1 | 4/2016 | Wu et al. |
| 2018/0061700 A1 | 3/2018 | Sun et al. |
| 2018/0374744 A1 | 12/2018 | Wu et al. |
| 2019/0067089 A1* | 2/2019 | Yang .................. H01L 23/5226 |

* cited by examiner

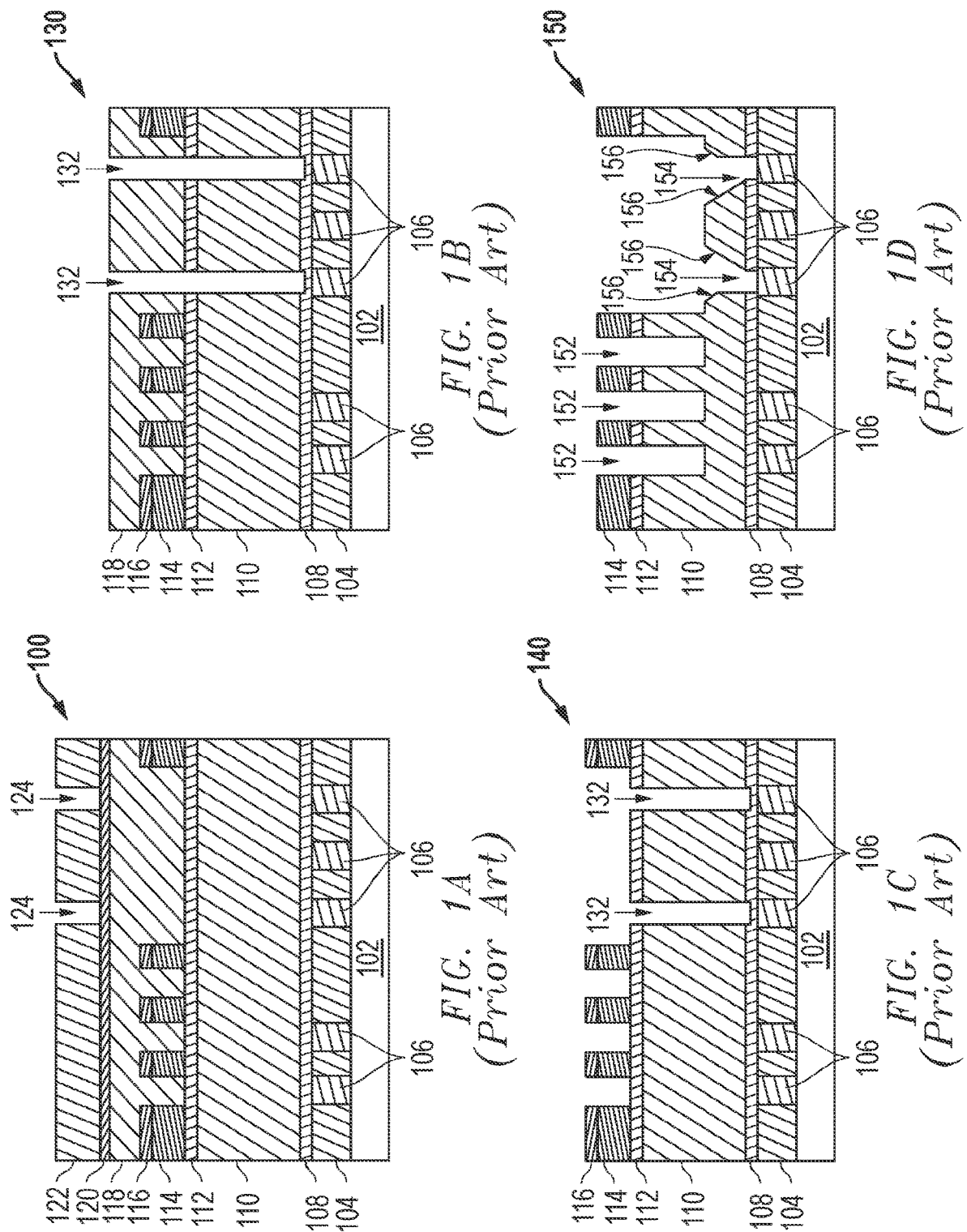

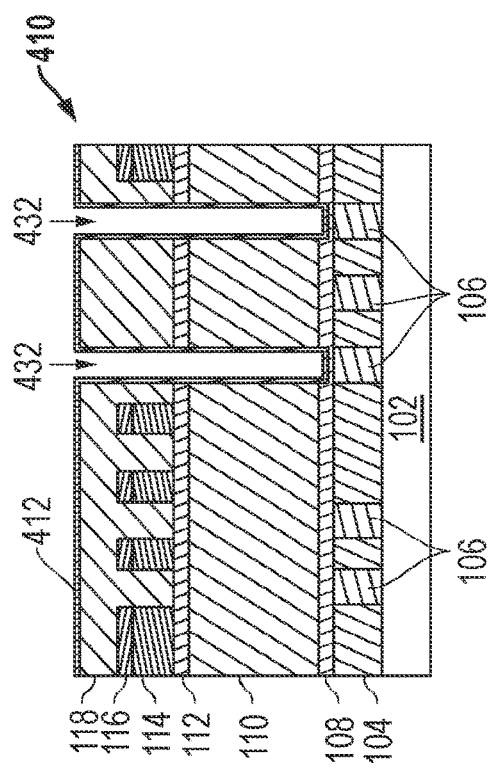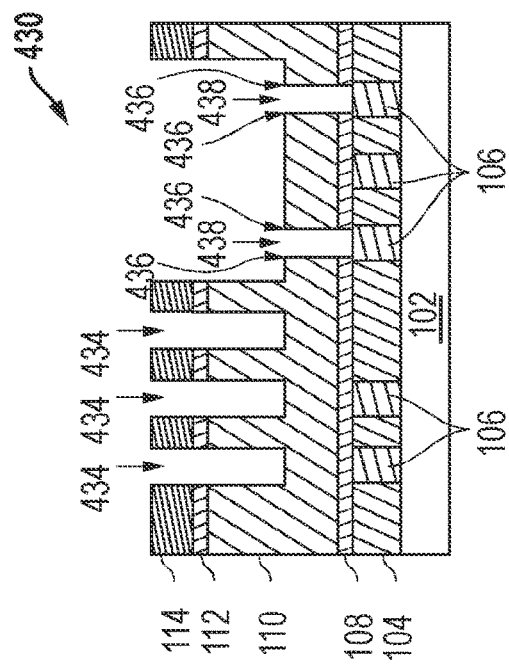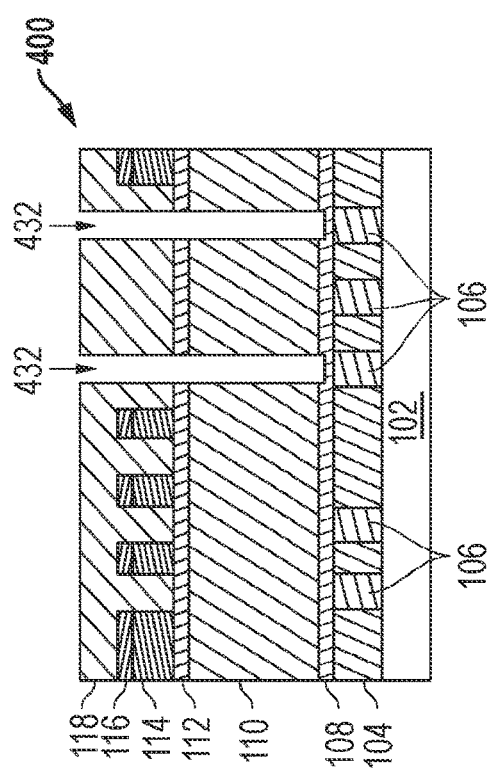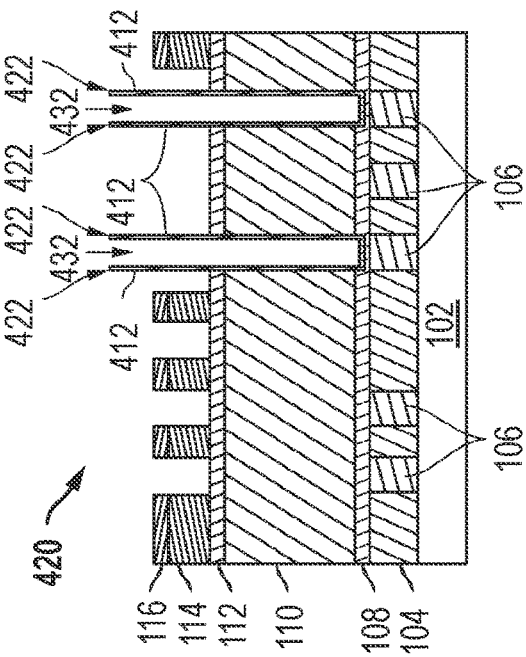
FIG. 4A
FIG. 4B
FIG. 4C
FIG. 4D

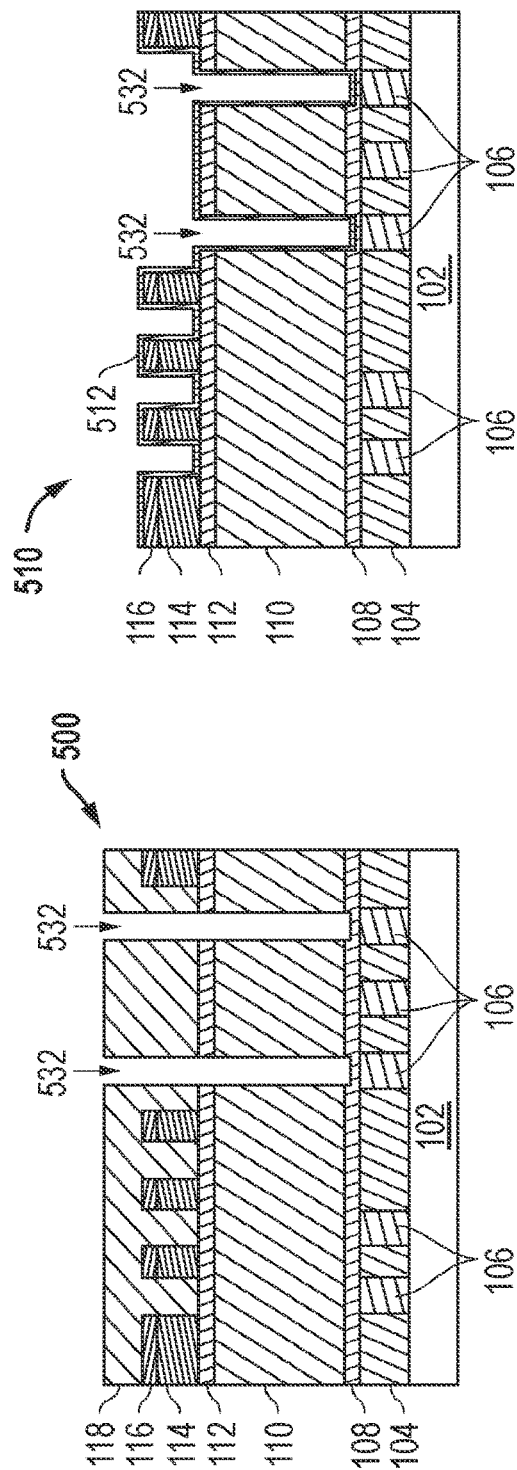
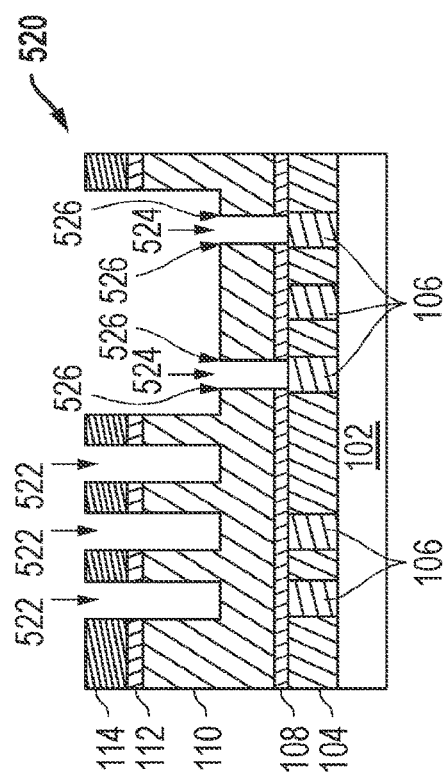
FIG. 5A
FIG. 5B
FIG. 5C

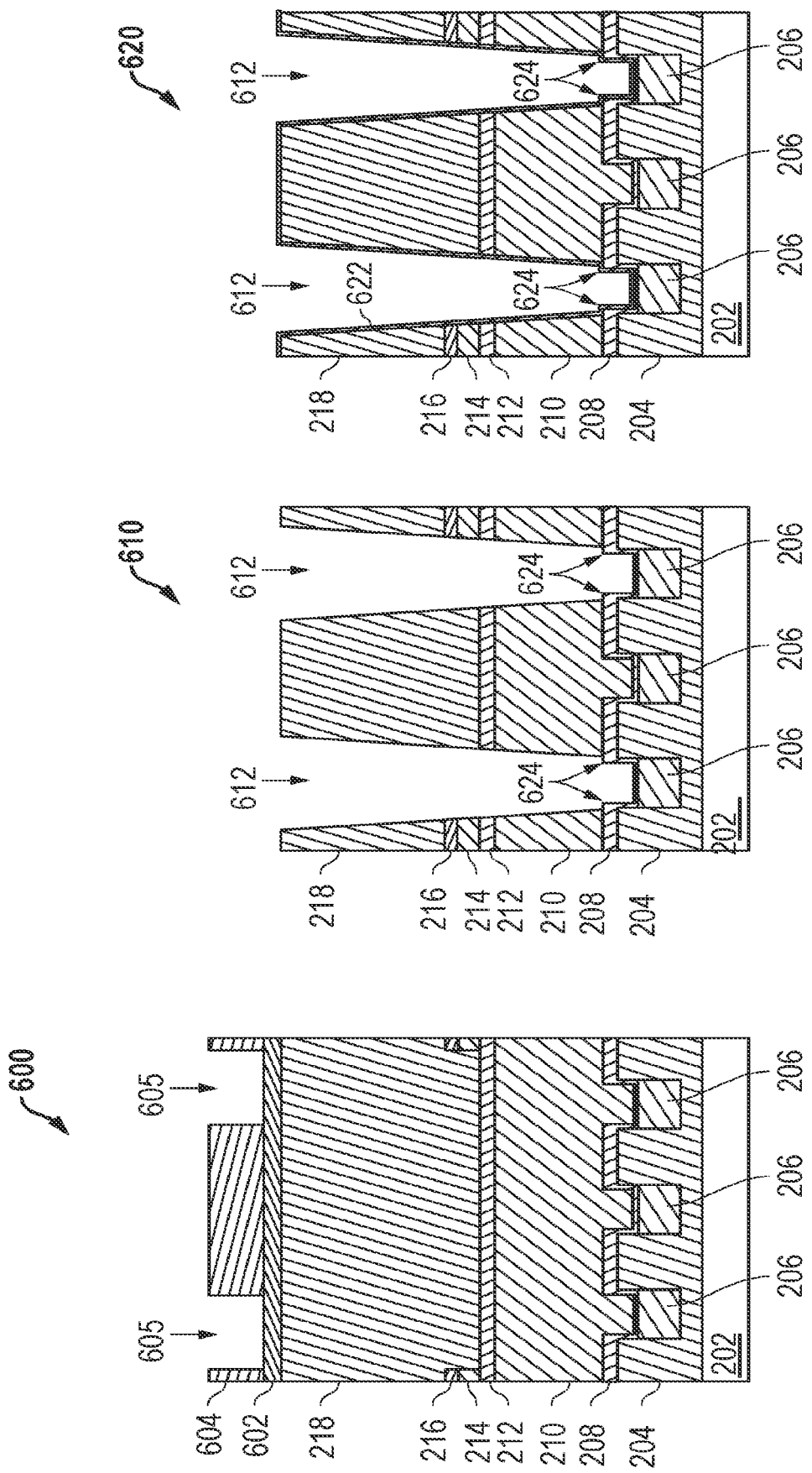

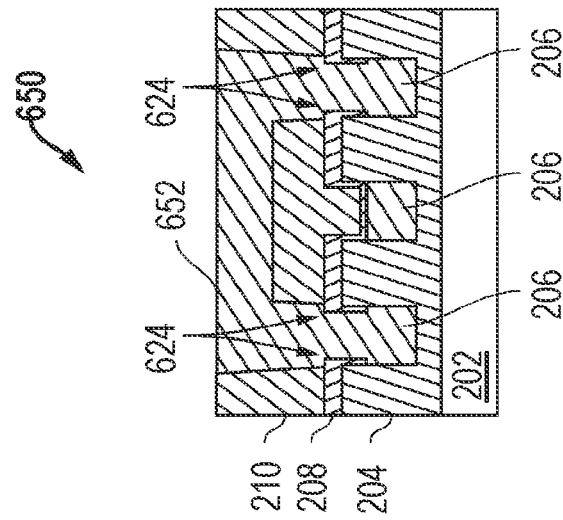
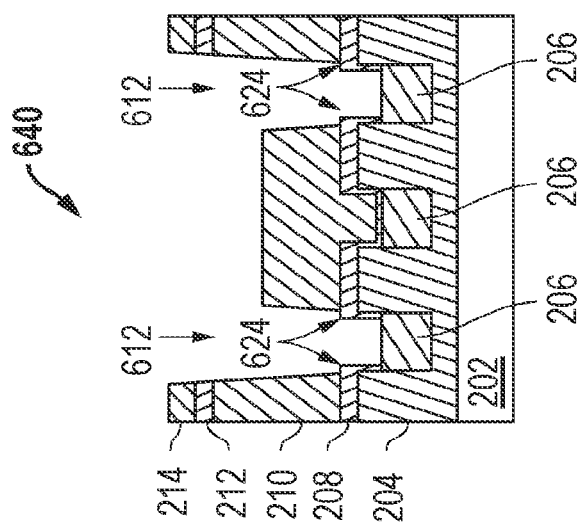
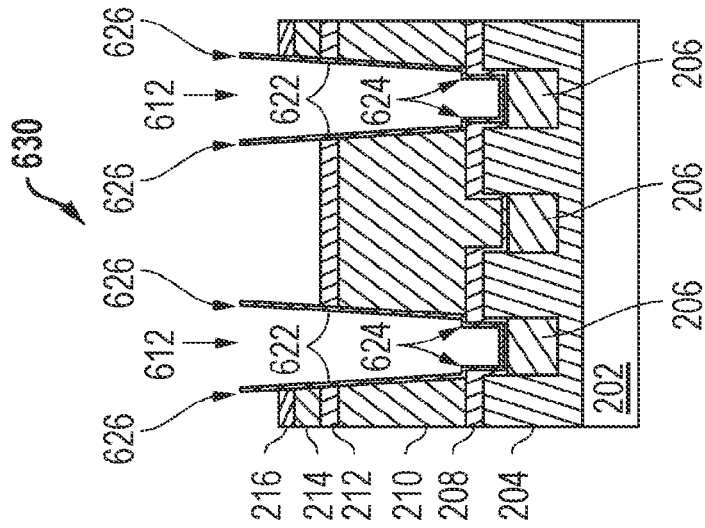

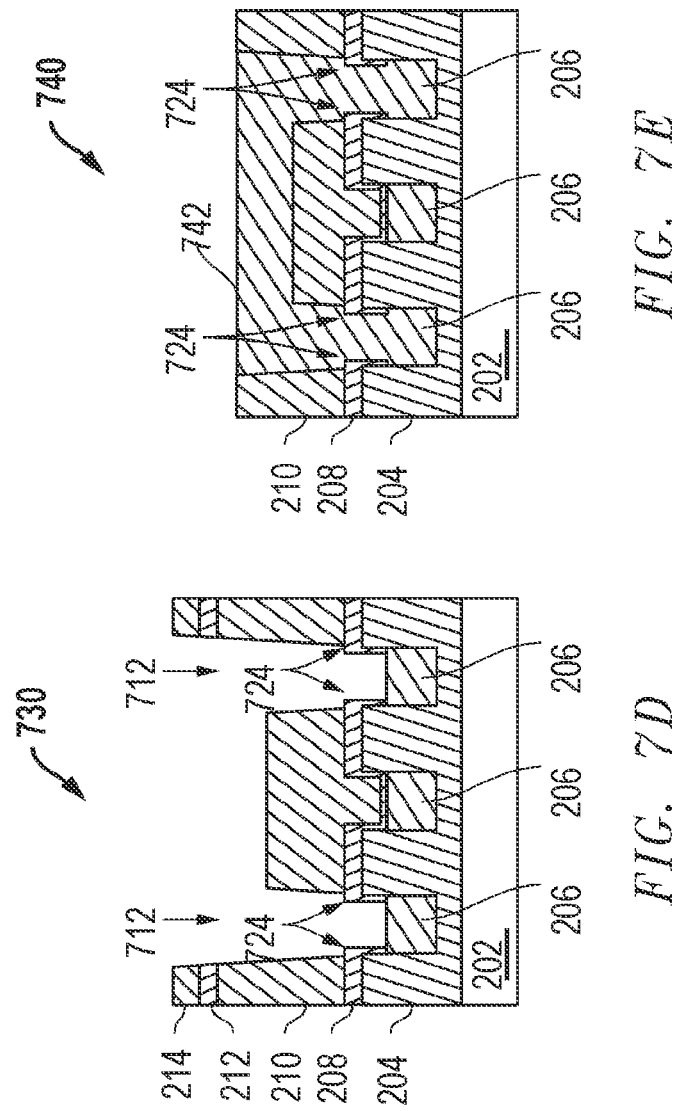

ALD (ATOMIC LAYER DEPOSITION) LINER FOR VIA PROFILE CONTROL AND RELATED APPLICATIONS

RELATED APPLICATIONS

This application is a continuation application for U.S. application Ser. No. 16/508,923, filed Jul. 11, 2019, which claims priority to the following provisional applications: U.S. Provisional Patent Application Ser. No. 62/696,540, filed Jul. 11, 2018, entitled "ALD (ATOMIC LAYER DEPOSITION) LINER FOR VIA PROFILE CONTROL AND RELATED APPLICATIONS" and U.S. Provisional Patent Application Ser. No. 62/767,805, filed Nov. 15, 2018, entitled "ALD (ATOMIC LAYER DEPOSITION) LINER FOR VIA PROFILE CONTROL AND RELATED APPLICATIONS" which are hereby incorporated by reference in their entirety and priority is claimed to each.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

Certain processes form vias and trenches, for example, as part of back end of line (BEOL) etch processes and fully self-aligned via (FSAV) etch processes. For example, during BEOL etch processes, profile control for the vias is important for high quality interlayer connections formed using these vias. Improved via profiles can improve chip yield, performance, reliability, and/or other parameters. However, via and trench etch processes are usually performed with one recipe for an all-in-one process flow. For example, one all-in-one process flow is a trench first metal hard mask (TFMHM) dual damascene process flow. Similar problems are experienced with FSAV etch processes. Further, as node sizes continue to be scaled down, via profile control has become harder and harder. For example, continued shrinking of vias while controlling via profiles becomes very difficult due to high aspect ratios. In addition, there are trade-offs between forming straight via profiles and decent selectivities among substrates because different stacked films have different etch behaviors and/or etch rates. As such, it has become increasingly difficult to control via profiles as features sizes have continued to shrink, and reduced profile control has led to reductions in yield, performance, reliability, and other parameters for microelectronic workpieces being manufactured.

FIGS. 1A-1D (Prior Art) and FIGS. 2A-2D (Prior Art) provide process flow diagrams for conventional BEOL and FSAV processes where via profile control is difficult as critical dimensions (CDs) shrink. This difficulty in profile control for vias has led to various problems in the microelectronic workpieces being manufactured.

Looking first to FIGS. 1A-1D (Prior Art), a BEOL process is shown for a traditional dual Damascene etch flow. As shown, this traditional BEOL integration uses a dual Damascene all-in-one process flow, which means that vias will be exposed to etch processes (e.g., plasma etch processes) for both via etch and trench etch process steps. These etch processes can be, for example, plasma etch processes.

FIG. 1A (Prior Art) is a cross-section diagram of an example embodiment 100 after openings 124 have been formed in a photoresist layer 122 previously formed over other layers on a substrate 102. For the embodiment 100, these layers include a dielectric layer 104 and metal contacts 106 on the substrate 102. An etch stop layer (ESL) 108 and a dielectric layer 110, such as a low dielectric constant (low-k) layer, are formed over a patterned metal layer include the metal contacts 106. The ESL 108 can be, for example, silicon nitride, silicon oxide, and/or another desired etch stop material. A hard mask layer 112 is formed over the dielectric layer 110. A patterned hard mask layer 116 and a patterned metal hard mask layer 114 are formed on top of a hard mask layer 112. An organic planarization layer 118 is formed over the patterned layers 114/116. Another hard mask layer 120 is formed over the organic planarization layer 118, and the photoresist layer 122 is formed over the hard mask layer 120. As shown, the openings 124 have been formed in the photoresist layer 122. It is also noted that the patterned layers shown for embodiment 100 are representative examples, and different and/or additional layers and structures could also be used.

FIG. 1B (Prior Art) is a cross-section diagram of an example embodiment 130 after vias 132 have been formed through the layers down to the etch stop layer 108. The photoresist layer 122 and the hard mask layer 120 have also been removed. For example, multiple etch processes, such as plasma etch processes, can be used to form the vias 132 and to remove the photoresist layer 122 and the hard mask layer 120. It is noted that the etch stop layer (ESL) 108 within the vias 132 have been partially etched during the via etch process.

FIG. 1C (Prior Art) is a cross-section diagram of an example embodiment 140 after the organic planarization layer 118 has been removed. For example, the organic planarization layer 118 can be removed with an ash process and/or an organic strip process.

FIG. 1D (Prior Art) is a cross-section diagram of an example embodiment 150 after one or more etch processes have formed trenches 152 and have further etched vias 132 in FIG. 1C down to the metal contacts 106 as indicated by arrows 154. As shown, this process flow typically damages dielectric layer 110 as indicated by arrows 156. This damage leads to undesired via profiles and chamfer profiles that are difficult to control. In particular, undesired large via CDs and bad chamfer angles are created by this traditional BEOL process.

FIGS. 2A-2C (Prior Art) and FIGS. 3A-3C (Prior Art) show ideal and real process flows respectively for a fully self-aligned via (FSAV) process. This FSAV process will ideally produce better via profiles and better reliability as compared to the dual Damascene process of FIGS. 1A-1B (Prior Art). As compared to the dual Damascene process of FIGS. 1A-1D (Prior Art), improvements can potentially be achieved through FSAV processes where bottom via critical dimension (CD) is confined by metal recess structures as shown for the ideal FSAV process in FIGS. 2A-2C (Prior Art). However, for real implementations, this FSAV process requires very highly selective plasma etch processes for via and/or trench formation, which are difficult to achieve. As such, actual trench formation as shown in FIGS. 3A-3C (Prior Art) lead to loss of FSAV features and difficulty in achieving improved yields and reliability that could otherwise be achieved using FSAV processes.

Looking now to FIGS. 2A-2C (Prior Art), example embodiments for an ideal process flow are shown for a fully self-aligned via (FSAV) process where vias are formed and defined by metal hard mask (MHM) layers.

FIG. 2A (Prior Art) is a cross-section diagram of an example embodiment 200 for an ideal process after vias 215 have been formed and leave desired FSAV corner features 222 within an etch stop layer (ESL) 208. The vias 215 have been formed through layers previously formed on a substrate 202. For the embodiment 200, the previously formed layers include a dielectric layer 204 and a patterned and recessed metal layer including metal contacts 206 on the substrate 102. An etch stop layer (ESL) 208 and a dielectric layer 210, such as a low dielectric constant (low-k) layer, are formed over the metal contacts 206. The ESL 208 can be, for example, silicon nitride, silicon oxide, and/or another desired etch stop material. A hard mask layer 212 is formed over the dielectric layer 210. A patterned hard mask layer 216 and a patterned metal hard mask layer 214 are formed on top of a hard mask layer 212. An organic planarization layer 218 is formed over the patterned layers 214/216. It is also noted that the patterned layers shown for embodiment 200 are representative examples, and different and/or additional layers and structures could also be used.

FIG. 2B (Prior Art) is a cross-section diagram of an example embodiment 220 after one or more etch processes have further etched vias 215 down to the metal contacts 206. The etch processes can be, for example, plasma etch processes. As shown for this ideal process, the desired FSAV corner features 222 still remain after this further trench etch process to open vias 215 down to the metal contacts 206.

FIG. 2C (Prior Art) is a cross-section diagram of an example embodiment 230 after a metallization process has added additional metal layer 232 above the metal contacts 206. After the metallization process, the metal layer 232 provides an electrical connection to the metal contacts 206. As shown for this ideal process, the desired FSAV corner features 222 still remain after this metallization process, and these ideal FSAV corner features 222 are desirable to facilitate reliable operation of the electronic devices being formed for the microelectronic workpiece.

FIGS. 3A-3C (Prior Art) provide a real process flow for a fully self-aligned via (FSAV) process where vias are formed and defined by a metal hard mask (MHM) layers. However, for real process flows, etch processes such as plasma etch processes can damage or lose self-aligned features, such as desired FSAV corner features 222 in FIGS. 2A-2C (Prior Art). This damage can lead to off-target CDs for vias formed through the real via formation processes such that target CD levels are not achieved. These off-target CDs for via formation can ultimately cause significant reductions in device yield due to shorts and can cause reduced reliability in resulting devices for the microelectronic workpieces being manufactured.

FIG. 3A (Prior Art) is a cross-section diagram of an example embodiment 300 for a real prior process after vias 315 have been formed down to etch stop layer (ESL) 208. Embodiment 300 is otherwise the same as embodiment 200 in FIG. 2A (Prior Art) for an ideal via formation process and includes the same previously formed layers on a substrate 202. It is again noted that the patterned layers shown for embodiment 300 are representative examples, and different and/or additional layers and structures could also be used.

FIG. 3B (Prior Art) is a cross-section diagram of an example embodiment 320 after one or more etch processes have further etched vias 315 down to the metal contacts 206. As shown for this real prior process, FSAV corner features 322 are damaged after this further trench etch process to further open vias 315. For example, they can be effectively removed by the further trench etch process, which can be a plasma etch process. These damaged corner feature 322 are in contrast to the desired FSAV corner features 222 shown in FIG. 2B (Prior Art).

FIG. 3C (Prior Art) is a cross-section diagram of an example embodiment 330 after a metallization process has added additional metal layer 232 above the metal contacts 206. After the metallization process, the metal layer 232 provides an electrical connection to the metal contacts 206. As shown for this real prior process, the damaged corner features 322 still remain after this metallization process, and these damaged corner features 322 potentially degrade yield and reliability for the electronic devices being formed for the microelectronic workpiece.

SUMMARY

Embodiments are described herein that provide improved via profile control by forming atomic layer deposition (ALD) liners to protect side walls of vias during subsequent etch processes. For example, such ALD liners can be used for BEOL etch processes including BEOL dielectric etch processes as well as for full self-aligned via (FSAV) processes. For one embodiment, ALD liners are used as protection or sacrificial layers for vias to reduce damage during tri-layer organic strip processes and/or ash and trench etch processes. The use of ALD liners helps to allow shrinking of via CDs while still controlling via profiles for various process applications, such as for example, dual Damascene processes and FSAV processes. In addition, the use of ALD liners allow improved control of the overall CD for via or hole formation, such as for example, control of the differences between top CDs and bottom CDs for vias formed during various processes. Different or additional features, variations, and embodiments can also be implemented, and related systems and methods can be utilized as well.

For one embodiment, a method to process microelectronic workpieces is disclosed including providing a substrate for a microelectronic workpiece having multiple layers, opening vias within the multiple layers, forming an atomic layer deposition (ALD) liner on the side walls of the vias, and etching the multiple layers, the ALD liner protecting the side walls of the vias during the etching. In further embodiments, the ALD liner includes at least one of silicon oxide, silicon nitride, titanium nitride, titanium oxide, aluminum nitride, and aluminum oxide.

In additional embodiments, the etching includes a trench etch. In further embodiments, the vias land on an etch stop layer above a patterned metal layer within the multiple layers for the substrate. In still further embodiments, the patterned metal layer includes metal contacts.

In additional embodiments, the multiple layers include an organic layer. In further embodiments, the ALD liner is formed over the organic layer. In further embodiments, the method includes removing the organic layer and etching back the ALD liner to leave ALD pillars along the side walls of the vias. In further embodiments, a height for the ALD pillars is controlled based upon at least one of a thickness for the organic layer or the etching back of the ALD liner. In still further embodiments, the method also includes removing the ALD pillars after the etching.

In additional embodiments, the multiple layers include an organic layer, and the method further includes removing the organic layer prior to forming the ALD liner. In further embodiments, the removing includes at least one of an ash process or an organic strip process. In further embodiments, the method also includes removing the ALD liner after the etching.

In additional embodiments, the opening, forming, and etching are part of a back end of line (BEOL) etch process. In further embodiments, the BEOL etch process includes a dual Damascene etch process. In further embodiments, the ALD liner protects one or more corner features within the vias.

In additional embodiments, the opening includes a fully self-aligned via (FSAV) process. In further embodiments, the ALD liner protects one or more corner features within the vias.

In additional embodiments, target via profiles are achieved using the ALD liner. In further additional embodiments, target critical dimensions (CDs) for the vias are achieved using the ALD liner. In still further additional embodiments, self-aligned features of the vias are achieved using the ALD liner.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1A-1D (Prior Art) provide cross-section diagrams of an example embodiment for a traditional BEOL process where a dual Damascene etch flow is used and via profile damage occurs during etch processes.

FIGS. 4A-4D provide cross-section diagrams of an example embodiment for a BEOL process where a dual Damascene etch flow is used and an ALD liner is formed to protect side walls for vias during subsequent etch processes.

FIGS. 5A-5C provide cross-section diagrams of an example embodiment for a BEOL process where the ALD liner is formed after removal of an organic planarization layer and still protecting side walls for vias during subsequent etch processes.

FIGS. 6A-6F provide cross-section diagrams of an example embodiment for a FSAV process where an ALD liner is formed before removal of an organic planarization layer to protect side walls for vias during subsequent etch processes.

FIGS. 7A-7E provide cross-section diagrams of an example embodiment for an FSAV process where the ALD liner is formed after removal of an organic planarization layer and still protecting side walls for vias during subsequent etch processes.

DETAILED DESCRIPTION

Figures 2A, 2B, 2C:
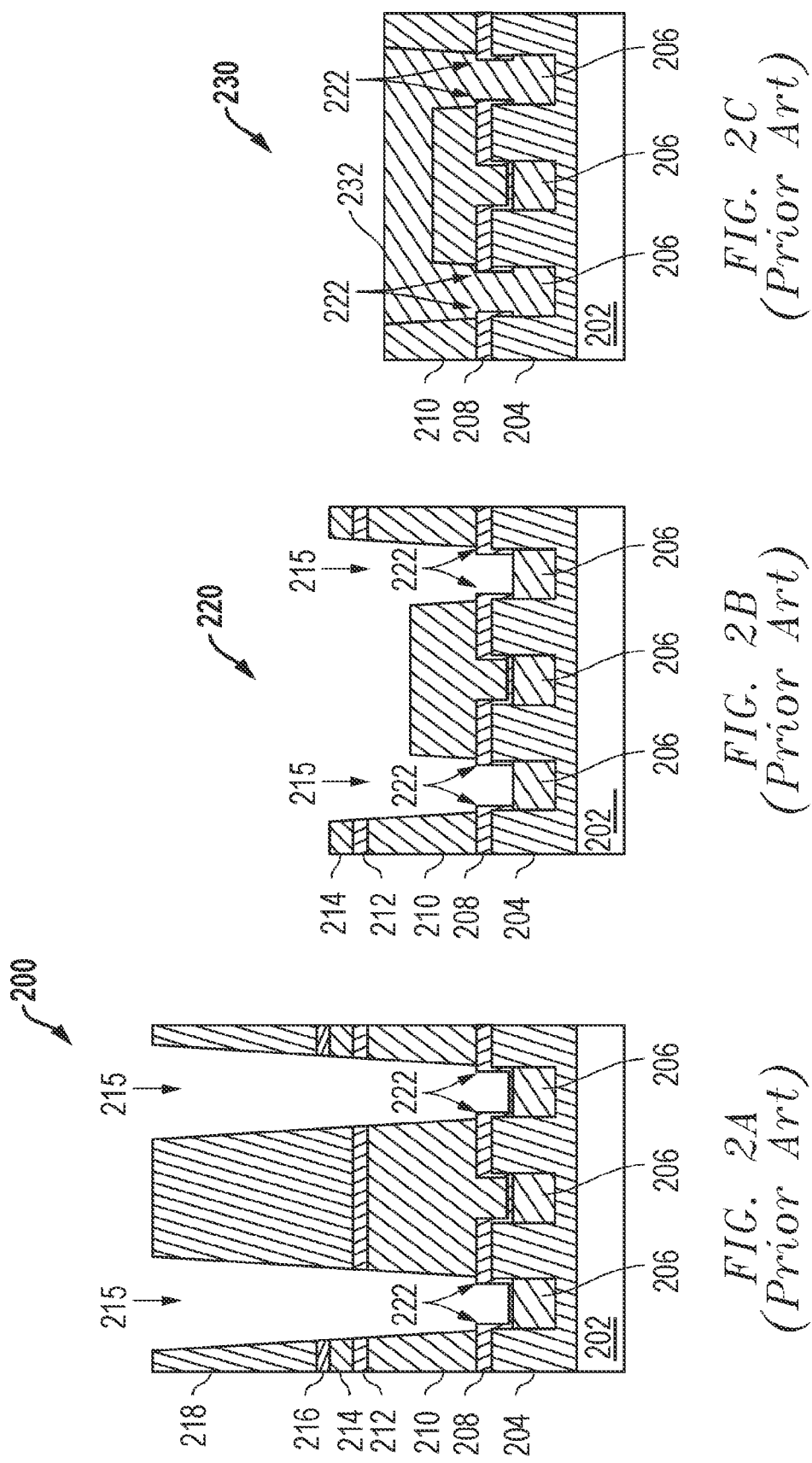
FIGS. 2A-2C (Prior Art) provide cross-section diagrams of an example embodiment for an ideal FSAV process where ideal FSAV corner features remain after etch processes.
Figures 3A, 3B, 3C:
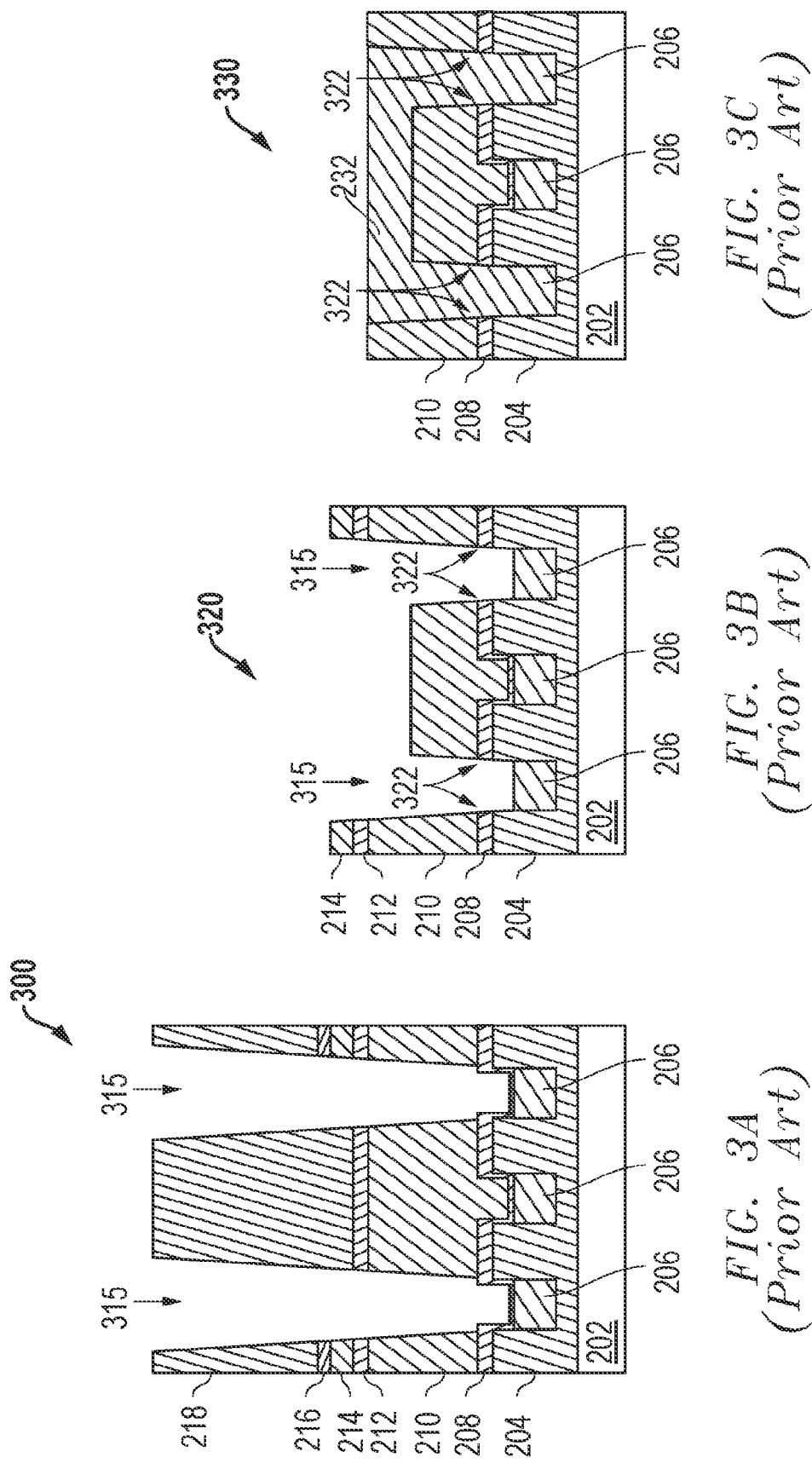
FIGS. 3A-3C (Prior Art) provide cross-section diagrams of an example embodiment for a traditional FSAV process where real FSAV corner features are damaged during etch processes.

As described herein, methods are disclosed to improve via profile control by forming atomic layer deposition (ALD) liners to protect side walls of vias during subsequent etch processes. The ALD liners described herein allow for improved control of via profiles even as features sizes and CDs continue to shrink for the manufacture of microelectronic workpieces. The via profiles to be controlled include, for example, via CDs, side wall shapes, corner profiles, and/or other related structures or features. Other advantages and implementations can also be achieved while still taking advantage of the process techniques described herein.

The ALD liners can be applied to a variety of processes including dual Damascene process flows as shown in FIGS. 4A-4D and FIGS. 5A-5C as well as FSAV process flows as shown in FIGS. 6A-6F and FIGS. 7A-7E. As shown for these example embodiments, an ALD film is deposited as a liner on side walls of vias after a partial via opening process has completed. After a subsequent organic layer ash/stripping process, the ALD liner is left on the side walls of the via, and this ALD liner protects the corner features from being seriously chopped and damaged during the trench etch process. For different embodiments, this ALD liner (e.g., in a pillar shape) can be controlled by adjusting the thickness of the organic layer upon which the ALD liner is formed or coated. Further, defects can be controlled with etch back processes for the ALD liner, and the ALD liner can be controlled and/or optimized to make sure the ALD pillars and/or other ALD structures are etched off after trench etch processes. Further, the ALD liner can be a sacrificial layer where it is etched off during a subsequent etch process such as a trench etch. These ALD liners protect side walls of vias and help to control via profiles during subsequent etch processes and thereby solve problems with prior solutions. Other variation can also be implemented.

It is noted that a variety of materials can be used to form the ALD liner, and one or more atomic layer deposition (ALD) processes can be used to form the ALD liner. For example, the ALD liner can be formed through one or more ALD processes using one or more of the following materials: silicon oxide (SiOx), silicon nitride (SiNx), titanium nitride (TiNx), titanium oxide (TiOx), aluminum nitride (AlN), aluminum oxide (AlO), and/or other desired materials. Other materials can also be used to form the ALD liners described herein.

Processing methods including the use of the ALD liners, as described herein, provide a number of advantages. For example, the ALD liners cause minimal adverse side effects because the ALD liners can be easily etched off. In addition, little or no trench effect is caused when the ALD-liners are formed before a fully organic strip process. Further, minimal additional process flow steps are required in integration flows because only ALD liner deposition and removal steps are required to be added. Still further, the ALD liner processes cause little or no additional damage to dielectric materials, such as low-K materials. The ALD liners also improve reliability as well as via profiles and chamfer angles for resulting devices formed for the microelectronic workpieces being manufactured.

Looking now to FIGS. 4A-4D, a BEOL process is shown for a dual Damascene etch flow where an ALD liner is applied to such dual Damascene process flow. As shown, this BEOL integration uses a dual Damascene all-in-one process flow, which means that vias will be exposed to etch processes (e.g., plasma etch processes) for both via etch and trench etch process steps. These etch processes can be, for example, plasma etch processes.

FIG. 4A is a cross-section diagram of an example embodiment 400 after partial vias 432 have been formed through multiple layers down to the etch stop layer 108. Embodiment 400 matches embodiment 130 in FIG. 1B (Prior Art). For the embodiment 400, previously formed layers include a dielectric layer 104 and a patterned metal layer including metal contacts 106 on the substrate 102. An etch stop layer (ESL) 108 and a dielectric layer 110, such as a low dielectric constant (low-k) layer, are formed over the metal contacts 106. The ESL 108 can be, for example, silicon nitride, silicon oxide, and/or another desired etch stop material. The vias 432 land on the etch stop layer 208 above the patterned metal layer which includes the metal contacts 106. A hard mask layer 112 is formed over the dielectric layer 110. A patterned hard mask layer 116 and a patterned metal hard mask layer 114 are formed on top of a hard mask layer 112. An organic planarization layer 118 is formed over the patterned layers 114/116. It is also noted that the patterned layers shown for embodiment 400 are representative examples, and different and/or additional layers and structures could also be used.

FIG. 4B is a cross-section diagram of an example embodiment 410 where an ALD liner 412 has been deposited to protect the side walls of the vias 432. This deposition of the ALD liner 412 occurs after the partial via open process as shown in FIG. 4A, and the ALD liner 412 is deposited on the organic planarization layer 118 as well as the side walls of the vias 432.

FIG. 4C is a cross-section diagram of an example embodiment 420 after the organic planarization layer 118 has been removed. For example, the organic planarization layer 118 can be removed with an organic ash process (e.g., partial or full) and/or an organic strip process. In addition, an etch back or stripping of the ALD liner 412 can be applied based on the process flow needs. For example, an etch back or stripping process can also be used to control the pillar height 422 of the ALD liner 412. This etch back/stripping process can also be used to decrease defects caused by introduction of ALD liner material on top of other layers or features for the microelectronic workpiece. For example, the ALD liner 412 can be deposited on the organic planarization layer 118, or the ALD liner 412 can be deposited on the top surface of other patterned structures where the organic planarization layer 118 is fully removed or ashed before deposition of the ALD liner 412. The etch back or stripping process is preferably an anisotropic etch, and more preferably a highly anisotropic and selective etch, to leave as much as possible of the ALD liner 412 on the side walls of the vias 432. Other variations can also be implemented.

FIG. 4D is a cross-section diagram of an example embodiment 430 after one or more etch processes have formed trenches 434 and have further etched vias 432 in FIG. 4C down to the metal contacts 106 as indicated by arrows 438. The ALD liner 412 in FIG. 4C has also been removed. As shown, this process flow does not damage the corner features 436 for the dielectric layer 110 adjacent the further etched vias due to the protection provided by the ALD liner 412 prior to its removal. Rather, the ALD liner 412 protects these corner features 436 during etch processes, such as plasma etch processes, that form the trenches 434 and further etch vias 432 down to the metal contacts 106 as indicated by arrows 438. As such, the ALD liners 412 in FIG. 4C help to improve via profiles, CD control and related features for vias being formed for patterned structures on substrates for microelectronic workpieces FIGS. 5A-5C provide a BEOL process for a dual Damascene etch flow where an ALD liner is applied to a dual Damascene process flow after an ash process, such as a partial organic ash or full organic ash, and/or an organic strip process.

FIG. 5A is a cross-section diagram of an example embodiment 500 after partial vias 532 have been formed through multiple layers down to the etch stop layer 108. Embodiment 500 matches embodiment 400 in FIG. 4A.

FIG. 5B is a cross-section diagram of an example embodiment 510 after the organic planarization layer 118 has been removed and an ALD liner 512 has been formed. For example, the organic planarization layer 118 can be removed with an organic ash process (e.g., partial or full) and/or an organic strip process. The ALD liner 512 can then be formed over the remaining patterned layers as well as the side walls of the vias 532.

FIG. 5C is a cross-section diagram of an example embodiment 520 after one or more etch processes, such as plasma etch processes, have formed trenches 522 and have further etched vias down to the metal contacts 106 as indicated by arrows 524. The ALD liner 512 in FIG. 5B has also been removed. As shown, this process flow does not damage the corner features 526 for the dielectric layer 110 adjacent the further etched vias due to the protection provided by the ALD liner 512 prior to its removal. Rather, the ALD liner 512 protects the edges of the dielectric layer 110 during etch processes, such as plasma etch processes, that form the trenches 522 and further etch vias 532 down to the metal contacts 106 as indicated by arrows 524. As such, the ALD liners 512 in FIG. 5B improve via profiles, CD control and related features for vias being formed for patterned structures on substrates for microelectronic workpieces.

FIGS. 6A-6F and FIGS. 7A-7E provide process flows for self-aligned via (FSAV) processes where vias are formed and defined by metal hard mask (MHM) layers and metal recess and where ALD liners are deposited to protect side walls of vias. As shown in these embodiments, the ALD liners protect vias and can be implemented in the FSAV process flows for protection of corner features for etch stop layers as well as protection for via side walls. For example, the ALD liners are used as protection layers and/or sacrificial layers in the FSAV etch/trench processes, and the ALD liners can also reform and protect the FSAV structures. As such, the ALD liners make the FSAV processes more effective.

Looking now to FIG. 6A, a cross-section diagram is provided of an example embodiment 600 after openings 605 have been formed in a photoresist layer 604 over other layers previously formed on a substrate 202. For the embodiment 600, these layers include a dielectric layer 204 and a patterned metal layer including metal contacts 206 on the substrate 202. An etch stop layer (ESL) 208 and a dielectric layer 210, such as a low dielectric constant (low-k) layer, are formed over the recessed metal contacts 206. The ESL 208 can be, for example, silicon nitride, silicon oxide, and/or another desired etch stop material. A hard mask layer 212 is formed over the dielectric layer 210. A patterned hard mask layer 216 and a patterned metal hard mask layer 214 are formed on top of a hard mask layer 212. An organic planarization layer 218 is formed over the patterned layers 214/216. Another hard mask layer 602 is formed over the organic planarization layer 218, and the photoresist layer 604 is formed over the hard mask layer 602. As shown, the openings 605 have been formed in the photoresist layer 604. It is also noted that the patterned layers shown for embodiment 600 are representative examples, and different and/or additional layers and structures could also be used.

FIG. 6B is a cross-section diagram of an example embodiment 610 for after vias 612 have been formed down to etch stop layer (ESL) 208. After the via etch process, the ESL 208 includes recessed corner features 624. The via etch process can be, for example, a plasma etch process. Embodiment 610 otherwise includes the same previously formed layers on a substrate 202 as embodiment 600 in FIG. 6A. It is again noted that the patterned layers shown for embodiment 250 are representative examples, and different and/or additional layers and structures could also be used.

FIG. 6C is a cross-section diagram of an example embodiment where an ALD liner 622 has been deposited as a coating to protect the side walls of the vias. The ALD liner 622 has also been formed over other layers such as the organic planarization layer 218. In part, the ALD liner 622 covers and protects the corner features 624 of the ESL 208. This deposition of the ALD liner 622 occurs after the partial via open process as shown in FIG. 6B.

FIG. 6D is a cross-section diagram of an example embodiment 630 after the organic planarization layer 218 has been removed. For example, the organic planarization layer 218 can be removed with an organic ash process (e.g., partial or full) and/or an organic strip process. In addition, an etch back or stripping of the ALD liner 622 can be applied based on the process flow needs. For example, the etch back or stripping process can also be used to control the pillar height 626 of the ALD liner 622. This etch back/stripping can also be used to decrease defects caused by introduction of ALD liner material on top of other layers or features for the microelectronic workpiece. For example, the ALD liner 622 can be deposited on the organic planarization layer 118, or the ALD liner 622 can be deposited on the top surface of other patterned structures where the organic planarization layer 118 is fully removed or ashed before deposition of the ALD liner 622. The etch back or stripping process is preferably an anisotropic etch, and more preferably a highly anisotropic and selective etch, to leave as much as possible of the ALD liner 622 on the side walls of the vias 612. Other variations can also be implemented.

FIG. 6E is a cross-section diagram of an example embodiment 640 after one or more etch processes have further etched vias 612 down to the metal contacts 206 and the ALD liner 622 has been removed. As shown, corner features 624 have been protected by the ALD liner 622 and remain after this further trench etch processes to further open vias 612. These undamaged corner features 624 are closer to the desired FSAV corner features 222 shown in the ideal process of FIGS. 2A-C (Prior Art).

FIG. 6F is a cross-section diagram of an example embodiment 650 after a metallization process has added additional metal layer 652 above the metal contacts 206. After the metallization process, the metal layer 652 provides an electrical connection to the metal contacts 206. As shown for this process, the corner features 624 remain undamaged after this metallization process, and these undamaged corner features 624 improve yield and reliability for the electronic devices being formed for the microelectronic workpiece.

FIGS. 7A-7E provide a FSAV process where the ALD liner is applied after an ash process, such as a partial organic layer ash or full organic ash, and/or an organic strip process.

Figure 7C:
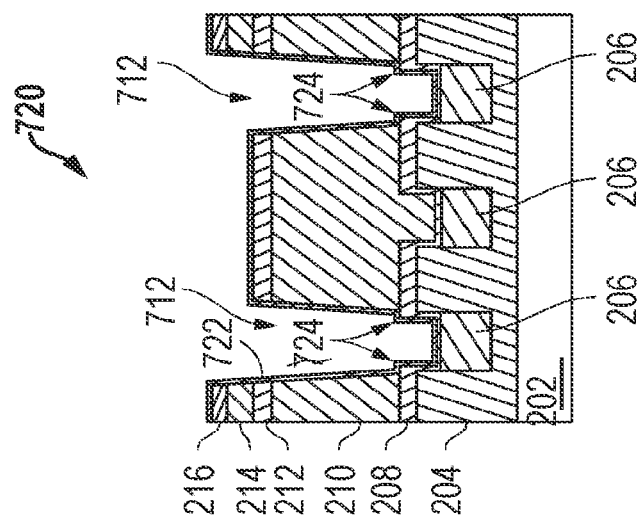
Figure 7B:
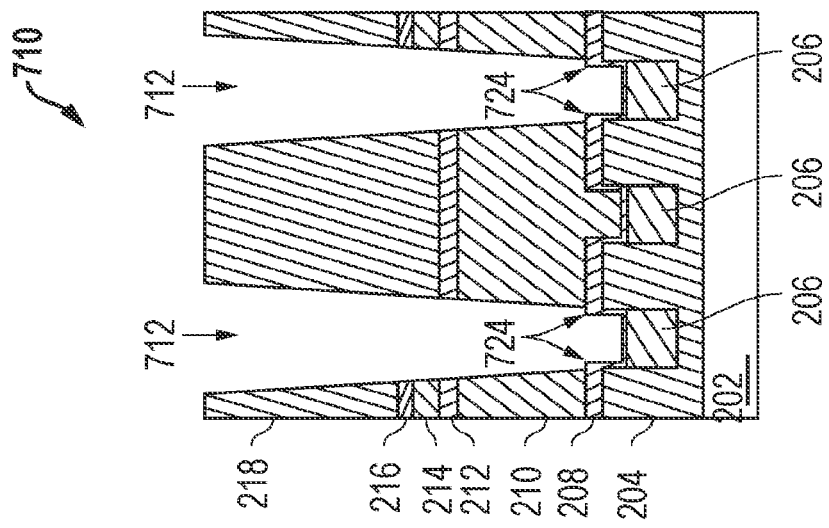
Figure 7A:
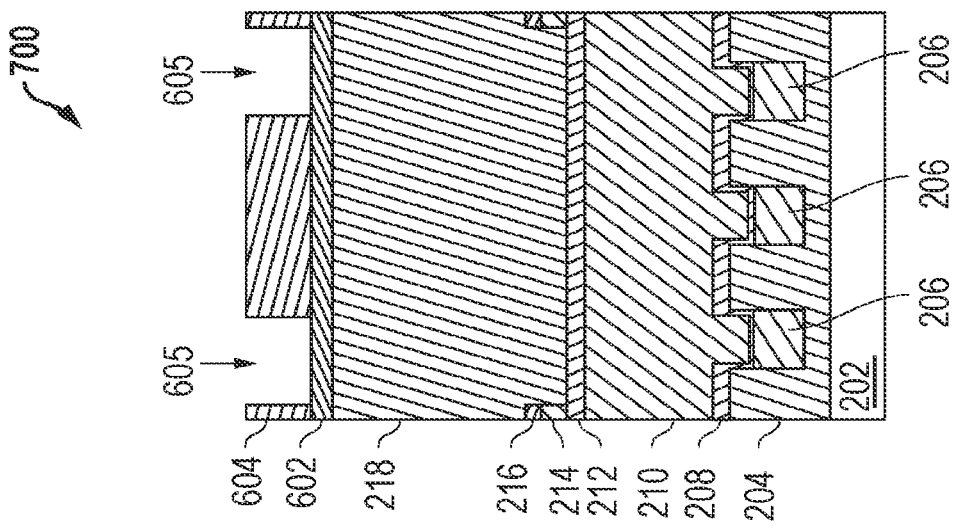

FIG. 7A is a cross-section diagram is provided of an example embodiment 700 after openings 605 have been formed in a photoresist layer 604 over other layers previously formed on a substrate 202. Embodiment 700 matches embodiment 600 of FIG. 6A.

FIG. 7B is a cross-section diagram of an example embodiment 710 for after vias 712 have been formed down to etch stop layer (ESL) 208. The ESL 208 includes recessed corner features 724. Embodiment 710 otherwise includes the same previously formed layers on a substrate 202 as embodiment 700 in FIG. 7A. It is again noted that the patterned layers shown for embodiment 250 are representative examples, and different and/or additional layers and structures could also be used.

FIG. 7C is a cross-section diagram of an example embodiment after the organic planarization layer 218 has been removed and an ALD liner 722 has been formed as a protective coating on the side walls of the vias. In part, the ALD liner 722 covers and protects the corner features 724 for the ESL 208. This deposition of the ALD liner 722 occurs after the organic planarization layer 218 has been removed. For example, the organic planarization layer 218 can be removed with an organic ash process (e.g., partial or full) and/or an organic strip process before deposition of the ALD liner 722.

FIG. 7D is a cross-section diagram of an example embodiment 730 after one or more etch processes, such as plasma etch processes, have further etched vias 712 down to the metal contacts 206. The ALD liner 722 in FIG. 7C has also been removed. As shown, corner features 724 have been protected by the ALD liner 722 and remain after this further trench etch process is performed to further open vias 712. These undamaged corner features 724 are closer to the desired FSAV corner features 222 shown for an ideal process in FIGS. 2A-C (Prior Art).

FIG. 7E is a cross-section diagram of an example embodiment 740 after a metallization process has added additional metal layer 742 above the metal contacts 206. After the metallization process, the metal layer 742 provides an electrical connection to the metal contacts 206. As shown for this process, the corner features 724 remain undamaged after this metallization process, and these undamaged corner features 724 improve yield and reliability for the electronic devices being formed for the microelectronic workpiece.

While examples have been shown for BEOL and FSAV processes, the ALD liners described herein can be used for other via/trench processes. The disclosed embodiments have been found to provide improved via profiles for a variety of process flows and node sizes, particularly for CD control and self-alignment features for vias being formed for patterned structures on substrates for microelectronic workpieces.

Figure 8:
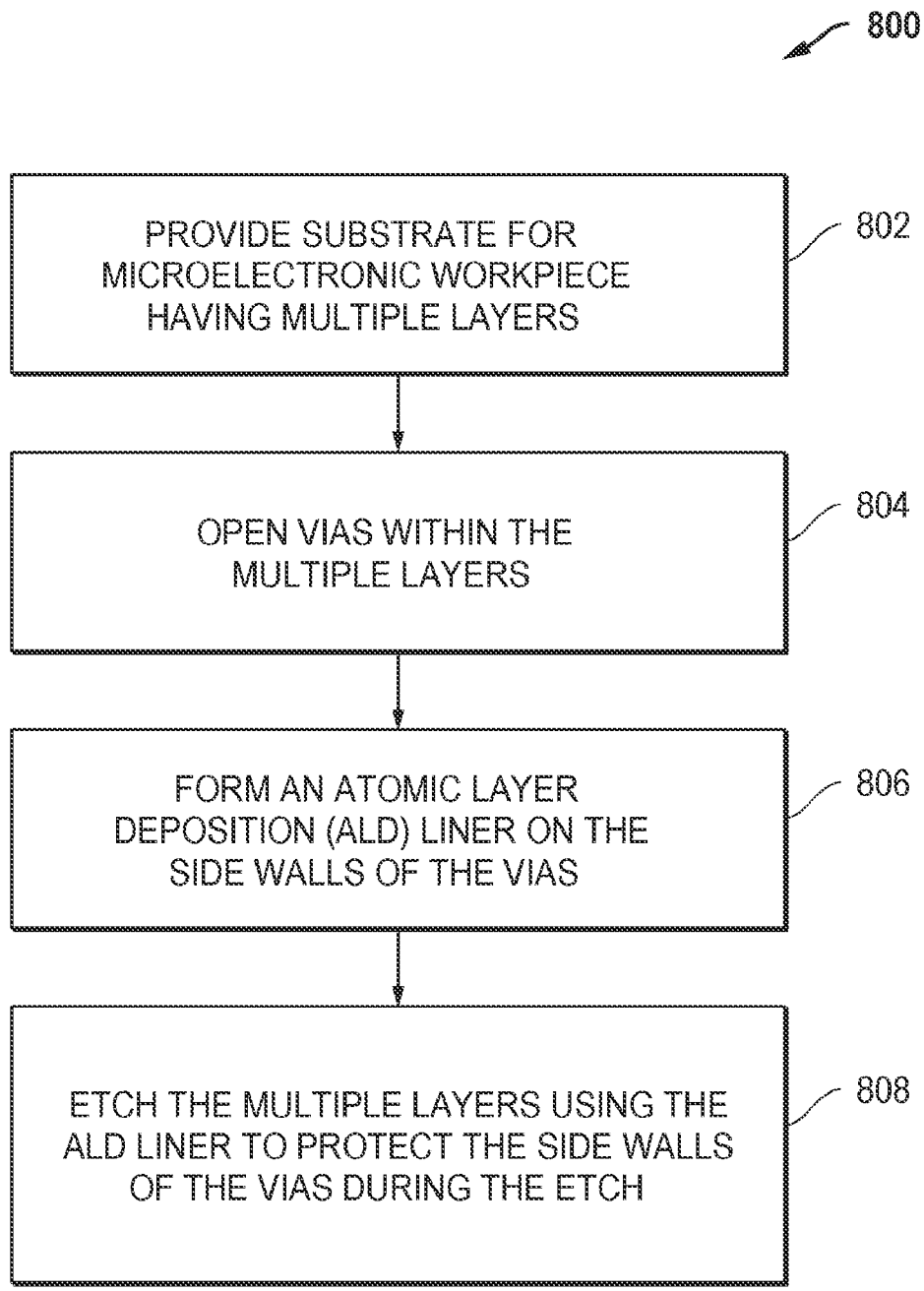
FIG. 8 provides a process flow diagram of an example embodiment where vias are opened in multiple layers formed on a substrate and where an ALD liner is used to protect side walls for the vias during subsequent etch processes.

FIG. 8 is a process diagram of an example embodiment 800 where vias are opened in multiple layers formed on a substrate, and an ALD liner is used to protect side walls for the vias during subsequent etch processes. In block 802, a substrate for a microelectronic workpiece is provided having multiple layers formed on the substrate. As described herein, these multiple layers can include one or more patterned structures or features that have been previously formed as well as one or more intervening layers. In block 804, vias are opened within the multiple layers. As described herein, these vias can extend down to an etch stop layer and/or another desired layer. In block 806, an ALD liner is deposited on the side walls of the vias. As described herein, this ALD liner can also be deposited over other structures or layers for the microelectronic work piece such as an organic planarization layer. In block 808, the multiple layers are further etched while the ALD liner is used to protect the side walls of the vias during the etch process. For example, one or more plasma etch processes can be used to further etch the multiple layers. It is noted that additional and/or different process steps could also be used while still taking advantage of the ALD liner protection techniques described herein.

The embodiments described herein allow target via profiles to be achieved by using the ALD liner to protect side walls for vias during etch processes. Further, the embodiments described herein allow target critical dimensions (CDs) for vias to be achieved using the ALD liner to protect side walls for vias during etch processes. By using the ALD liner as a protection or sacrificial layer for the vias, damage is reduced during subsequent strip processes such as tri-layer organic strips processes and/or ash and trench etch processes. As such, the ALD liner allows for the shrinking of via CDs in various applications such as dual Damascene and FSAV processes. In addition, the ALD liner can be used to control via or hole overall CD parameters such as the difference or delta between top CD and bottom CD for the via formation.

The ALD liner material can be deposited using a variety of techniques. For example, the ALD liner can be uniformly deposited on the side walls of vias or selectively deposited on some side walls of vias. The ALD liner can then be etched off relatively easily during subsequent process steps. For some embodiments, an ALD liner layer etch back or strip is implemented to remove top liner film in order to reduce defects.

Trench structures can remain unaffected by the addition of the ALD liner, for example, where the ALD liner is deposited before an organic layer ash or stripping process. It is further noted, however, that the ALD liner can be deposited after a partial organic ash/strip or after a full organic ash/strip according to different applications.

Other variations can also be implemented while still using an ALD liner to protect vias and allow for reduced CDs while still controlling via profiles and other structure profiles such as chamfer angles.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing a microelectronic workpiece, comprising:
   providing a substrate having at least one of a dielectric layer or a metal layer, and a layer to be protected above the at least one of the dielectric layer or the metal layer, the substrate further including multiple layers above the layer to be protected, the layer to be protected including an etch stop layer;
   etching to form an opening through the multiple layers in a direction toward the at least one of the dielectric layer or the metal layer, the opening extending below at least a part of the etch stop layer so that a corner portion of the etch stop layer is exposed in the opening;
   forming an atomic layer deposition (ALD) liner on at least part of the etch stop layer at the corner portion;
   after forming the ALD liner:
   removing the ALD liner with the corner portion of the etch stop layer remaining after removing the ALD liner; and
   filling at least a portion of the opening.

2. The method of claim 1, wherein:
   prior to forming the ALD liner, the etching through the multiple layers exposes the corner portion of the etch stop layer such that a side portion and a top portion of the corner portion are exposed in the opening and another top portion of the etch stop layer is covered by one of the multiple layers; and
   after removing the ALD liner and prior to filling at least a portion of the opening, the side portion and the top portion of the corner portion remain and are exposed in the opening.

3. The method of claim 2, wherein the one of the multiple layers which covers the another top portion of the etch stop layer is a dielectric layer, and after forming the ALD liner the ALD liner covers a side wall of the dielectric layer.

4. The method of claim 3, wherein the multiple layers further include an organic planarization layer (OPL), the method further including removing the OPL prior to the filling of at least a portion of the opening, the removing of the OPL removing portions of the OPL outside of the opening.

5. The method of claim 4, wherein the OPL is removed before forming of the ALD by an ashing or a strip process.

6. The method of claim 4, wherein the OPL is removed by an ashing or a strip process, and the OPL is removed after forming of the ALD and before removing of the ALD.

7. The method of claim 4, wherein the etch stop layer comprises silicon oxide or silicon nitride.

8. The method of claim 7, wherein the at least one of the dielectric layer or the metal layer includes a first metal layer, and after removing the ALD liner, the first metal layer is exposed, and wherein the filling of at least a portion of the opening includes depositing a second metal layer in contact with the first metal layer.

9. The method of claim 1, wherein the at least one of the dielectric layer or the metal layer includes a first metal layer, and after removing the ALD liner, the first metal layer is exposed, and wherein the filling of at least a portion of the opening includes depositing a second metal layer in contact with the first metal layer.

10. The method of claim 9, wherein the at least one of the dielectric layer or the metal layer further includes a first dielectric layer adjacent the first metal layer, and wherein the multiple layers above the layer to be protected include a second dielectric layer; and
    wherein the forming of the ALD liner forms the ALD liner on a side wall of the second dielectric layer and the removal of ALD liner exposes the side wall of the second dielectric layer, and after the filling of at least a portion of the opening with the second metal layer, the second metal layer is in contact with the second dielectric layer.

11. The method according to claim 1, further including after forming the ALD liner and prior to removing the ALD liner, performing at least one of an ashing, a stripping or a further etching and thereafter removing the ALD liner, the at least one of the ashing, the stripping or the further etching being separate from the etching to form the opening.

12. The method according to claim 1, wherein the removing of the ALD liner is performed in conjunction with one or more further etching processes performed after forming the ALD liner and separate from the etching to form the opening.

13. A method of processing a microelectronic workpiece comprising:
    providing a substrate having a first metal layer, a first adjacent layer adjacent to the first metal layer, a layer to be protected above the first metal layer and the first adjacent layer, and a second adjacent layer above the layer to be protected, the layer to be protected including an etch stop layer;
    performing an etching, the etching forming an opening through the second adjacent layer with portions of the second adjacent layer remaining adjacent the opening and a side wall of the second adjacent layer is exposed in the opening, and wherein after the etching a side wall of the etch stop layer is also exposed in the opening;
    forming an atomic layer deposition (ALD) liner on the side wall of the second adjacent layer and a side wall of the etch stop layer;
    removing the ALD liner, with the etch stop layer remaining after removing of the ALD liner; and
    depositing a second metal layer in at least part of the opening such that the second metal layer is in contact with the first metal layer and the side wall of the etch stop layer, and after depositing the second metal layer, the second adjacent layer is adjacent the second metal layer.

14. The method of claim 13, wherein the second metal layer is deposited to extend over a top of the second adjacent layer.

15. The method of claim 13, wherein after the etching, the etch stop layer includes a corner exposed in the opening, the corner including a side portion and a first top portion exposed in the opening, and wherein the second adjacent layer is above a second top portion of the etch stop layer;

the forming of the ALD liner forms the ALD liner on both the side portion and the first top portion of the corner of the etch stop layer;

removing of the ALD liner exposes the side portion and the first top portion of the corner of the etch stop layer; and after depositing the second metal layer, the second metal layer is in contact with the side portion and the first top portion of the corner of the etch stop layer.

16. The method of claim 15, wherein the first adjacent layer is a first dielectric layer and the second adjacent layer is a second dielectric layer.

17. The method of claim 16, wherein the second metal layer is deposited over a top of the second dielectric layer, and the etch stop layer comprises at least one of:
   a silicon nitride layer; or
   a silicon oxide layer.

18. The method according to claim 13, further including after forming the ALD liner and prior to removing the ALD liner, performing at least one of an ashing, a stripping or a further etching and thereafter removing the ALD liner, the at least one of the ashing, the stripping or the further etching being separate from the etching to form the opening.

19. The method according to claim 13, wherein the removing of the ALD liner is performed in conjunction with one or more further etching processes performed after forming the ALD liner and separate from the etching to form the opening.

* * * * *